United States Patent [19]

Miyagi

[11] 4,343,078
[45] Aug. 10, 1982

[54] IGFET FORMING METHOD

[75] Inventor: Isamu Miyagi, Tokyo, Japan

[73] Assignee: Nippon Electric Co., Ltd., Tokyo, Japan

[21] Appl. No.: 127,337

[22] Filed: Mar. 5, 1980

[30] Foreign Application Priority Data

Mar. 5, 1979 [JP] Japan .................................. 54/25291
Jun. 7, 1979 [JP] Japan .................................. 54/71406

[51] Int. Cl.³ ...................... H01L 21/28; H01L 21/22
[52] U.S. Cl. ........................................ 29/571; 29/591; 148/187
[58] Field of Search ......................... 29/571, 590, 591; 148/187, 188, 189

[56] References Cited

U.S. PATENT DOCUMENTS

| 3,972,756 | 8/1976 | Nagase et al. | 148/187 X |
| 4,113,533 | 9/1978 | Okamura et al. | 148/187 |
| 4,170,492 | 10/1979 | Bartlett et al. | 148/187 X |
| 4,179,311 | 12/1979 | Athanas | 148/1.5 |
| 4,182,023 | 1/1980 | Cohen et al. | 29/571 |
| 4,198,250 | 4/1980 | Jecmen | 148/1.5 |

Primary Examiner—G. Ozaki
Attorney, Agent, or Firm—Sughrue, Mion, Zinn, Macpeak & Seas

[57] ABSTRACT

An insulated-gate field effect transistor for high speed operation is disclosed in which the internal resistance of the gate electrode is reduced and the stray gate capacitance is maintained at a low value. In one embodiment, the reduction of the internal resistance of the gate electrode is effected by leading the gate electrode out of the transistor structure across, but above, the drain or source region in a bridge-like fashion. According to the method disclosed herein, the degree of integration of such IC devices is enhanced, and the lengths of the gate insulator film and the channel may be precisely defined.

8 Claims, 32 Drawing Figures

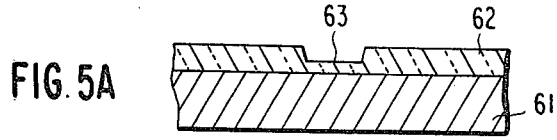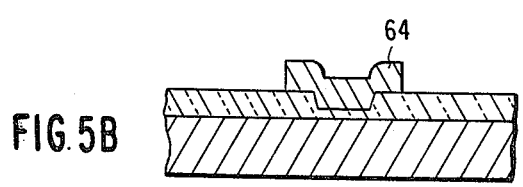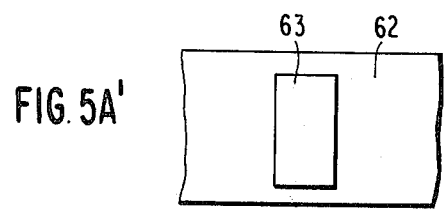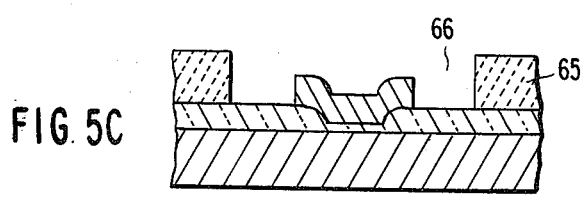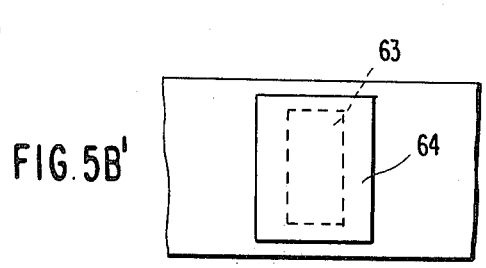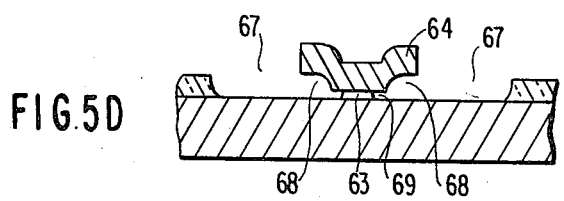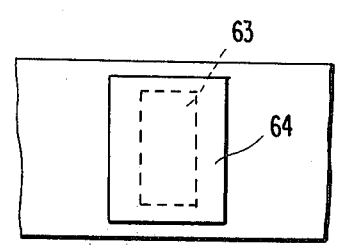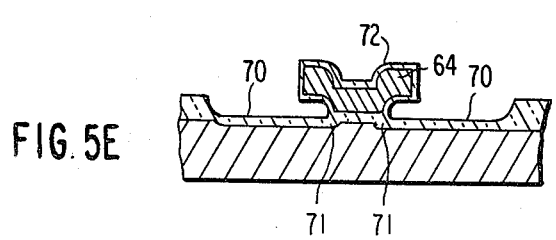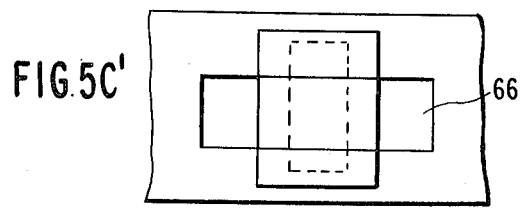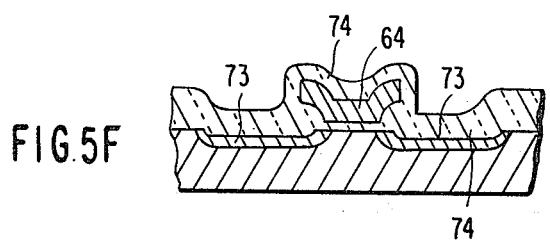

IGFET FORMING METHOD

BACKGROUND OF THE INVENTION

1. Field of the Invention

The present invention relates to an insulated-gate field effect transistor (hereinafter called IGFET) and a method for manufacturing the same.

2. DESCRIPTION OF THE PRIOR ART

One of the known IGFET's was obtained through the steps of forming, in a semiconductor substrate of one conductivity type, drain and source regions of the opposite conductivity type, forming a thin insulating gate film on the surface of the semiconductor substrate between these regions, thereafter forming apertures in an insulation coating film covering the source and drain regions, providing lead out ohmic electrodes from the drain and source regions through the apertures, and also providing a gate electrode on the gate film. However, such an IGFET becomes large in geometrical configuration, and hence, prevents the enhancement of degree of integration of monolithic semiconductor ICs. Also, the gate electrode and the drain and source regions, respectively, overlap with each other at the side end portions of the thin insulating gate film, and therefore, there is a disadvantage in that the gate electrode is associated with a stray capacitance and thus improvements in the electric performance of such types of IGFET are prevented.

On the other hand, in order to improve the disadvantage of the above-described IGFET, a silicon-gate type IGFET was proposed which can be attained through the steps of forming a thin insulating gate film on a surface of a semiconductor substrate of one conductivity type, depositing a polycrystalline silicon film on the insulating gate film by vapor growth, selectively etching this polycrystalline silicon film to form a gate electrode pattern, diffusion an impurity of the opposite conductivity type into the gate electrode of polycrystalline silicon and into the substrate by using the gate electrode as a mask to form drain and source regions of the opposite conductivity type in the substrate and providing ohmic electrodes for the drain and source regions. The resultant silicon-gate IGFET has a gate electrode self-aligned with the source and drain regions, so that there is no substantial overlap therebetween. If the channel length is shortened for the purpose of enhancing the operation speed, however, the plane configuration of the gate electrode becomes correspondingly narrow, or in other words, it is necessary to select one edge of the polycrystalline silicon film to be used as a gate electrode equal to the small channel length, and accordingly the internal resistance of the gate electrode is necessarily increased, so that restriction imposed upon the desired high speed operation. Moreover, there is a topological restriction in that the gate electrode must be necessarily led out in the direction of the channel width.

This restriction has served as a bar against enhancement of the degree of integration of the semiconductor monolithic integrated circuit employing a large number of IGFETs in which source and drain regions are formed by self-alignment with respect to a gate electrode. More particularly, when the above-mentioned silicon gate type IGFET is normally used with a wiring layer of metal having a low specific resistance such as aluminum or the like connected to a silicon gate electrode, variations of the threshold voltage of the IGFET during use are caused when a silicon gate electrode connects to a metal wiring layer above a gate insulator film. Therefore, it is necessary to electrically lead out the silicon gate electrode to the region where the gate insulating film is not present thereunder, that is, to the region above the thick field insulating film, by means of conductive polycrystalline silicon which forms the gate electrode, and to connect ohmically the gate electrode to the metal wiring layer at that region. However, in view of the heretofore known method for manufacturing a silicon gate IGFET, the gate electrode consisting of the polycrystalline silicon film cannot be extended easily over the drain (source) region in a three-dimensional crossing form, and hence there the topological restriction that the gate electrode must be lead out in the direction of the channel width. Thus, this restriction has served as a great bar against enhancement of the degree of integration of the semiconductor monolithic integrated circuit employing a large number of transistors of such type.

Moreover, when the gate electrode of the prior art silicon gate IGFET is shaped by subjecting a polycrystalline silicon film to selective wet etching, it is difficult to shorten with good precision the channel length of the IGFET, which largely contributes to its electrical performance, because the precision of the etching is poor. Namely, the polycrystalline silicon film must have a thickness of 5000 Å to 8000 Å, while upon wet etching of polycrystalline silicon, side-etching is effected in the lateral direction by about one-half of the depth of etching, so that the edge of the etched region takes a tapered shape as side-etched by 2500 Å to 4000 Å. Furthermore, since the etching speed is increased by the use of a liquid temperature caused by chemical reaction upon etching and thus the amount of the side-etching per se cannot be controlled at good precision, it is a difficult problem to form a predetermined shape of the gate electrode with good precision from a thick polycrystalline silicon form of 5000 Å to 8000 Å.

SUMMARY OF THE INVENTION

Therefore, it is one object of the present invention to provide an IGFET having a small internal resistance of a gate electrode and a small stray gate capacitance which is suitable and effective for high speed operations.

Another object of the present invention is to provide an IGFET having a small internal resistance of a gate electrode, in which the gate electrode can be freely led out in a desired direction in the plane pattern to be effectively connected to a low resistance wiring layer.

Still another object of the present invention is to provide an effective method for manufacture of the IGFET in which the IGFET can be manufactured with high precision.

According to one feature of the present invention, there is provided an IGFET comprising a semiconductor substrate of one conductivity type having a major surface, a thick field insulator such as a thick silicon oxide layer selectively provided on the major surface of the substrate, a thin gate insulating film formed on the major surface and having a substantially uniform thickness, a gate electrode made of a high melting point material such as polycrystalline silicon or molybdenum, the gate electrode including a first portion formed directly on the gate insulating film and at least one second portion extending from the first portion and projecting upwardly, the second portion being separated from the major surface of the substrate by a distance larger than the thickness of the gate insulating film, source and drain regions of the opposite conductivity type formed in the major surface of the substrate, the source and drain regions being in a self-alignment with said first portion of the gate electrode or with said gate insulating film, and a channel region positioned under the gate insulating film and between the source and drain regions.

The gate electrode may be led out from its second portion by means of a lead-out portion made of the same material as the gate electrode and crossing over the source or drain region in a three-dimensional position. The lead-out portion may be connected to a wiring layer on the thick field insulator.

According to another feature of the present invention, there is provided an IGFET comprising a semiconductor substrate of one conductivity type, a field insulator film along the major surface of the semiconductor substrate, an active region provided contiguously to or surrounded by the field insulator film, source and drain regions of the opposite conductivity type provided in the active region, a channel region provided between the source and drain regions, a gate insulating film formed on the channel region, and a gate electrode provided on the gate insulating film, the gate electrode including a first portion contacting with the gate insulating film and a second portion projecting from the first portion over the source or drain region, and separated from the surface of the region by a distance larger than the thickness of the gate insulating film, the gate electrode being led out onto the field insulator film and electrically connected to a wiring layer thereon.

The drain and source regions may be self-aligned with the gate insulating film or the first portion of the gate electrode. The gate electrode may be led out from the second portion by a a lead-out section made of the same material as that of the first and second portions.

Since such an IGFET can have a wide gate electrode irrespective of the channel length, that is, since the second portion of the gate electrode is additionally provided, the internal resistance of the gate electrode becomes small and the IGFET can achieve a high speed operation.

In addition, as the gate electrode can be freely led out in a desired direction, crossing over the source or drain region in a three-dimensional fashion, the degree of integration of the IC device can be enhanced. Moreover, if the leading out is effected from the gate electrode portion approximately at the center of the channel width, then the internal resistance between the gate electrode portions at the extremities of the channel width and the gate electrode portion at the lead-out is minimized, and thus the high speed operation can be further improved.

The above-mentioned gate electrode in the IGFET according to the present invention can be effectively realized not only by the silicon layer but also by a layer of high melting point metal such as molybdenum or the like.

According to another feature of the present invention, there is also provided a method for manufacturing an IGFET comprising the steps of coating one major surface of a semiconductor substrate of one conductivity type with an insulator coating film and a gate insulating film that is thinner than the former coating film, forming a film of a material which can stand a high temperature and serve as a gate electrode on said gate insulating film and on a part of said coating film, removing said insulator coating film to expose the substrate surface by employing as a mask either said gate electrode only or a photo resist film obtained by adding a photo-etching step and said gate electrode in combination, forming drain and source regions of the opposite conductivity type to the substrate by doping with an impurity and oxidizing through the exposed surface portion, and forming ohmic electrodes for the drain and source regions, respectively.

According to further feature of the present invention, there is provided a method for manufacturing a semiconductor device comprising the steps of selectively forming an anti-oxidation coating film on one major surface of a semiconductor substrate, forming a embedded field oxide film by making uase of said anti-oxidation coating film as a mask, partly removing the anti-oxidation coating film, forming a semiconductor layer which extends from the removed portion over the remaining anti-oxidation coating film up to the field oxide film, removing the remaining anti-oxidation coating film to form a cavity between the semiconductor layer and the semiconductor substrate, and thereafter forming an impurity region contiguous to the field oxide film within the semiconductor substrate under said cavity by introducing an impurity into the semiconductor substrate.

Through the above-featured method for manufacture according to the present invention, an IGFET can be obtained in which drain and source regions of the opposite conductivity type with respect to the substrate are formed in a self-aligning fashion by making use of a thin gate insulating film on the surface of the semiconductor substrate of one conductivity type, and in which the gate electrode and a portion of the drain (source) region overlap with each other on the opposite sides of a insulator film that is thicker than said gate insulating film. Furthermore, according to the above-featured manufacturing method, irrespective of the precision of shaping of the gate electrode, an IGFET having a short channel length can be obtained with good precision.

The above-mentioned and other features and objects of the present invention will become more apparent by reference to the following description of its preferred embodiments taken in conjunction with the accompanying drawings.

BRIEF DESCRIPTION OF THE DRAWINGS

FIG. 1E' is a plan view of the structure shown in FIG. 1E;

FIGS. 3E' and 3G' are plan views of the structures shown in FIGS. 3E, and 3G, respectively;

FIGS. 5A to 5F are cross-sectional views showing the successive steps in the method for manufacture of an IGFET according to a third preferred embodiment of the present invention; and FIGS. 5A', 5B' and 5C' are plan views of the structures of FIGS. 5A, 5B and 5C, respectively.

DESCRIPTION OF THE PREFERRED EMBODIMENTS

First Embodiment

Figure 1A:
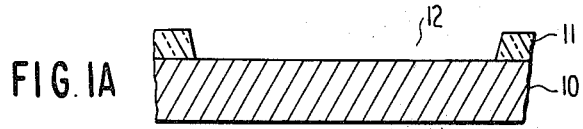
FIGS. 1A through 1G are cross-sectional views showing the successive steps in the method for the manufacture of an IGFET according to a first preferred embodiment of the present invention.
Figure 1B:
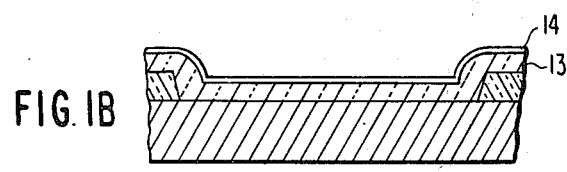
Figure 1C:
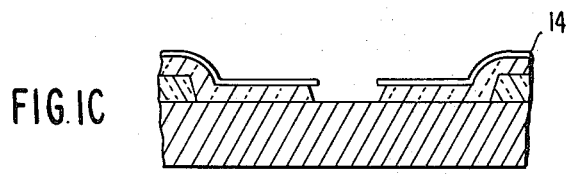
Figure 1D:
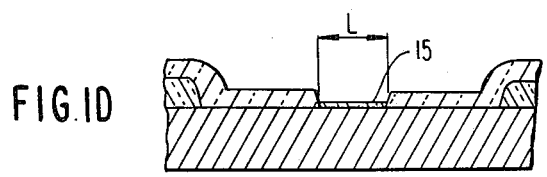

Referring to FIG. 1A, a silicon dioxide film 11 of 5000 to 8000 Å in thickness, which serves as a field insulator film, is formed on a P-type monocrystalline silicon substrate 10 over its entire surface by oxidizing, and an aperture 12 is formed in the silicon dioxide film 11 a well known photo-etching method. Thereafter, a silicon nitride film 13 of 4000 Å in thickness is deposited over the entire surface by vapor growth, and subsequently a silicon dioxide film 14 of about 100 Å in thickness is grown by oxidizing the silicon nitride film 13 through thermal oxidation for 100 minutes at 1000° C. within a steam atmosphere (FIG. 1B). Then an aperture is provided in the silicon dioxide film 14 by photo-etching, and after a photo-resist used for providing the aperture has been removed, the silicon nitride film 13 is selectively removed by making use of the silicon dioxide film 14 as a mask to expose the surface of the substrate 10 (FIG. 1C). Next, the silicon dioxide film 14 used as a mask is entirely removed. Thereafter, the exposed surface portion of the substrate 10 is converted into silicon dioxide by subjecting it to thermal oxidation for 10 minutes at 950° C. in a steam atmosphere, and thereby a gate insulating film 15 to 500 to 800 Å in thickness is formed so as to have a length L equal to 3 μm (FIG. 1D).

Figure 1E:
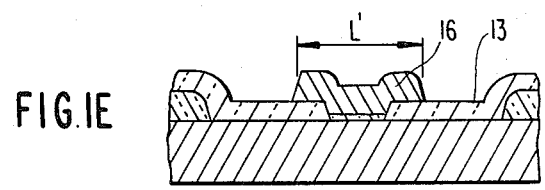
Figure 1F:
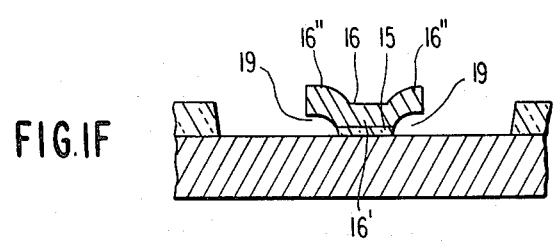
Figure 1G:
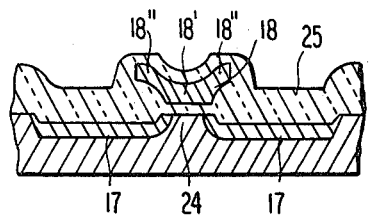
Figure 1E:
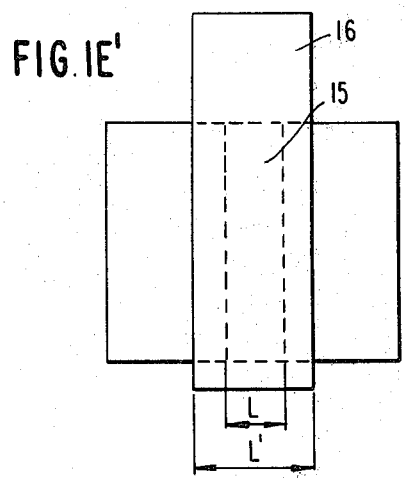
Figure 2:
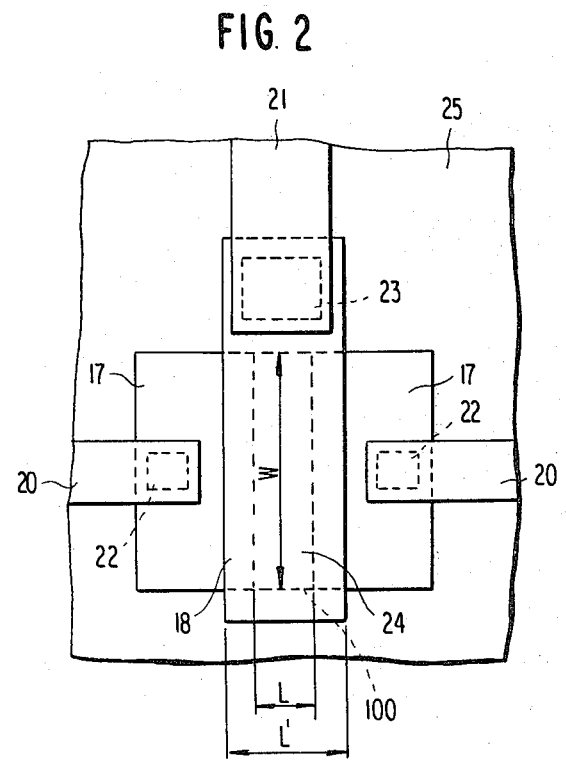
FIG. 2 is a plan view of the IGFET according to the first preferred embodiment of the present invention.

Thereafter, polycrystalline silicon is deposited over the entire surface up to a thickness of about 8000 Å, selectively removed by photo-etching to leave a portion 16 which is to be used as a gate electrode. The length L' of this gate electrode 16 is selected to be 5 μm so as to project by 1 μm from the respective edges of the gate insulating film 15 (FIGS. 1E and 1E'). Subsequently, the silicon nitride film 13 is entirely removed through an etching process by employing an etching liquid which hardly etches polycrystalline silicon and silicon dioxide but predominantly etches a silicon nitride film, such as, for example, phosphoric acid at a high temperature. Thereby a cavity 19 of about about 4000 Å in height of formed under the portions 16" of the polycrystalline silicon film projecting by 1 μm from the portion 16" directly above the gate insulating film 15 on each side (FIG. 1F). Next, diffusion, of phosphorus is effected for 50 minutes at 920° C. to make phosphorus diffuse into the substrate 10 and the polycrystalline silicon layer 16, and then steam oxidation is effected for 20 minutes at 900° C., thereby to form a gate electrode 18, having an impurity concentration of $1 \times 10^{20}$ atoms/cm$^3$ and a surface resistivity of $\rho_s = 15 \sim 20$ ohm/square, and N-type source and drain regions 17 having a phosphorus concentration of $1 \times 10^{20}$ atoms/cm$^3$, a surface of $\rho_s = 10 \sim 12$ ohm/square and a depth of 0.8 μm. The projected portions 16" of the polycrystalline silicon layer do not interfere with the diffusion during the diffusion process, because the projected portions 16" are at the height of about 4000 Å from the substrate surface. Since the diffusion in the lateral direction penetrates into the region under the gate insulating film 15 by about 0.6 μm, the length of the channel 24 between the source and drain regions 17 becomes about 1.8 μm. By the oxidation process which follows the diffusion process, a silicon dioxide film 25 is formed in the space above the substrate including the cavity 19 and in the periphery of the gate electrode (FIG. 1G). Then apertures 22 and 23 are formed in the silicon dioxide film 25, and through these apertures 22 and 23, respectively, aluminum wiring layers 20 are connected to the source and drain regions 17, while an aluminum wiring layer 21 is connected to the gate electrode 18, whereby an N-channel type IGFET can be completed (FIG. 2).

In such an IGFET, the gate electrode 18 extends to the outside of the gate insulating film. However, the extended portions 18" project upwards from the portion 18' directly above the channel 24 and the height of the projecting portions 18" of the gate electrode from the substrate is as high as 8000 Å owing to the steam oxidation. Since this height is about 10 times as large as the thickness of the gate insulating film, the gate capacitance in this preferred embodiment is increased only by a negligibly small rate of 6~7% as compared to the self-alignment type silicon gate IGFET in the prior art. On the other hand, the length of the gate electrode 18 can be selected to be L' = 5 μm, and hence the internal resistance of the gate electrode 18 can be reduced by a factor of 0.6, while the self-alignment type silicon gate transistor in the prior art is compelled to take the value of the length of the gate electrode of L = L' = 3 μm. This is very important for FET for high speed operations, and if the width W of the channel region 24 in FIG. 2 is 50 μm, according to the present invention the operation of the peripheral portion of the channel, that is, at the portion 100 becomes faster than the FET in the prior art by a factor of about 1.56. Moreover, although it is normally difficult to shape a polycrystalline silicon layer of 8000 Å in thickness with high precision, according to the present invention the precision in forming an aperture in the silicon nitride film 13 is higher than the precision in shaping the thick polycrystalline silicon layer, and hence the gate insulator film length as well as the channel length can be defined precisely.

Second Embodiment

A second preferred embodiment increases the degree of integration of IC devices and also the operation speed, in addition to reducing the internal resistance of the gate electrode which is attained by the first preferred embodiment.

Figure 3A:
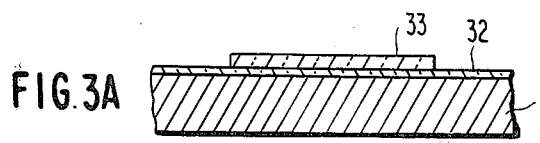
FIGS. 3A through 3I are cross-sectional views showing the successive steps in the method for manufacture of an IGFET according to a second preferred embodiment of the present invention.
Figure 3G:
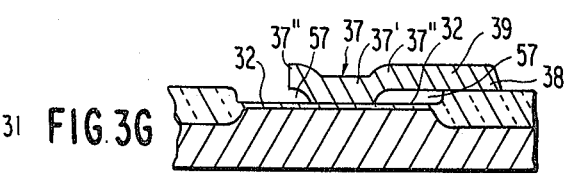
Figure 3B:
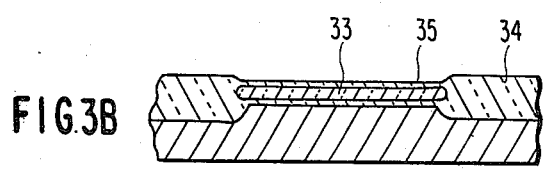
Figure 3H:
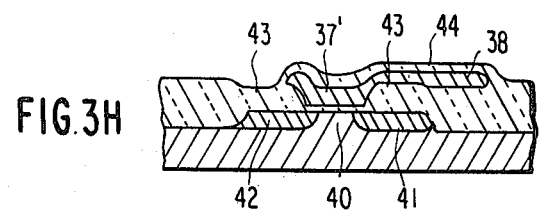
Figure 3C:
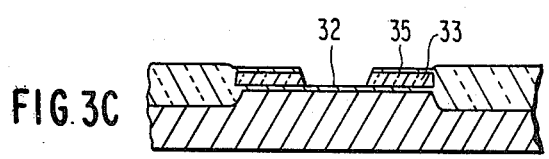
Figure 3I:
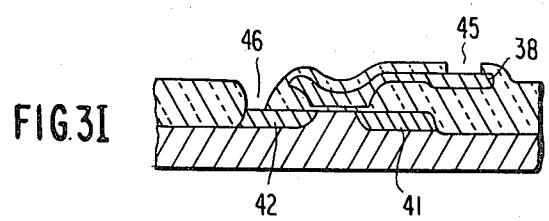
Figure 3D:
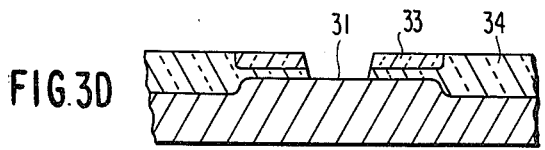
Figure 3E:
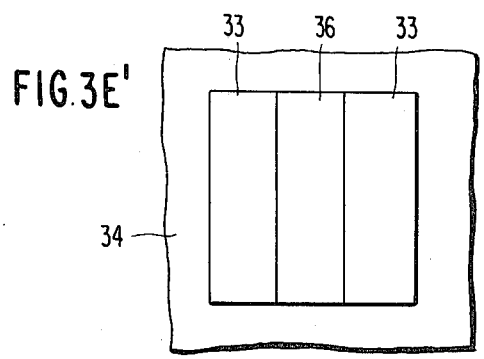
Figure 3E:
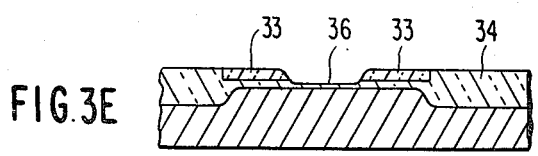
Figure 3F:
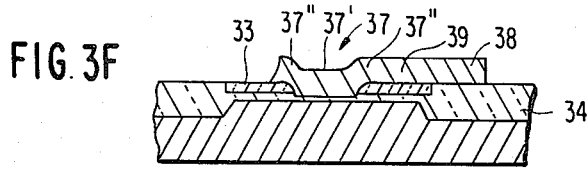
Figure 3G:
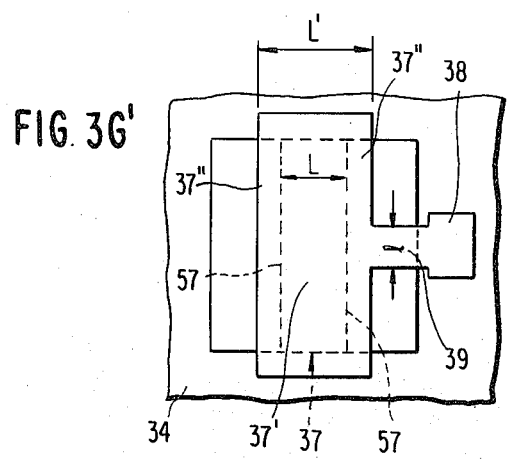
Figure 4A:
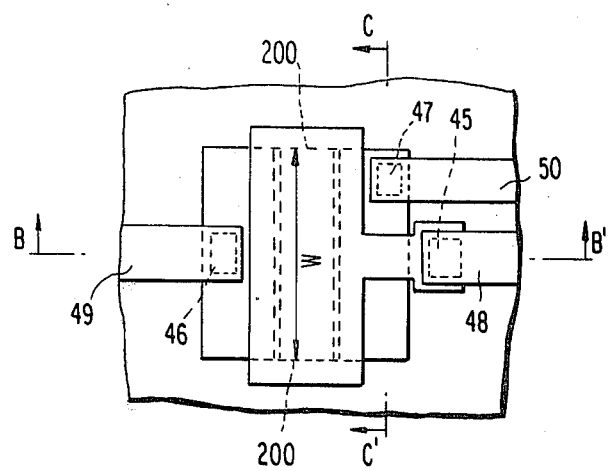
FIG. 4A is a plan view of the IGFET according to the second preferred embodiment of the present invention.

Referring to FIGS. 3A–3I, a silicon dioxide film 32 of 900~1100 Å in thickness is formed over the entire surface of a P-type monocrystalline silicon substrate 31 having a specific resistivity of 3 ohm-cm by thermally oxidizing the substrate 31, and a silicon nitride film, which is an anti-oxidation film, of 2000~2500 Å in thickness is deposited over the entire surface of the silicon dioxide film 32 by vapor growth, which is then subjected to a photo-etching process to leave an island-shaped portion 33 of silicon nitride (FIG. 3A). Subsequently, thermal oxidation is conducted for 5 hours at 1000° C. within a steam atmosphere, and thereby the surface of the silicon substrate 31 not covered by the silicon nitride film 33 is deeply oxidized into a silicon dioxide film 34 of 1.0~1.3 μm in thickness which serves as a thick field insulator film embedded in the substrate, while the surface of the silicon nitride film 33 is slightly oxidized into a silicon dioxide film 35 of 100~800 Å (FIG. 3B). A portion of the silicon dioxide film 35 where a channel region is to be formed is selectively removed by photo-etching, and the exposed portion of the silicon nitride film 33 is etched by making use of the remaining silicon oxide film 35 as a mask to expose the partial surface of the silicon dioxide film 32 (FIG. 3C). Then, etching is performed over the entire surface of the silicon dioxide films 34 and 35 and the exposed silicon dioxide film 32, to remove the silicon dioxide film 35 and the surface portion of the embedded silicon dioxide film 34 so that the surface of the exposed silicon nitride piece 33 and the surface of the silicon dioxide film 34 may become flush with each other. At the same time, the exposed silicon dioxide film 32 is completely removed, portion of the silicon substrate 31 at the intended channel region is exposed (FIG. 3D). Then, a gate insulator film 36 of silicon dioxide having a thickness of 500~700 Å is newly formed on the exposed surface of the substrate 31 by thermal oxidation for 10 minutes at 950° C. in steam atmosphere (FIG. 3E and FIG. 3E'). A polycrystalline silicon film of 5000~6000 Å in thickness is deposited over the entire upper surface of FIG. 3E by vapor growth, which film to then subjected to selective etching to leave a gate electrode and lead portion 37 which includes a gate electrode portion 37' directly on the gate insulator film 36, an extended gate portions 37" extending from the portion 37' onto the silicon nitride film 33, a lead-out connection portion 38 on the field oxide film 34 and a bridge portion 39 bridging the gate electrode portion 37" and the connection portion 38 (FIG. 3F). Thereafter, the silicon nitride film 33 is entirely removed by immersing the structure of FIG. 3F in a hot phosphoric acid solution. As a result, cavities 57 are formed right under the extended gate portions 37" and the bridge portion 39 polycrystalline silicon (FIG. 3G and G'). Next, phosphorus is doped into the substrate 31 by melt-through-diffusion through the thin oxide film 32 conducted for 80 minutes at 920° C., and oxidation is carried out for 20 minutes at 900° C., thereby to form on opposed sides of a channel 40 source and drain regions 41 and 42 having an impurity concentration of $1 \times 10^{20}$ atoms/cm$^3$ and a depth of about 0.8 μm (FIG. 3H). The extended gate portions 37" which project outwardly by about 1 μm do not interfere with the diffusion because of the height of the projection is about 2000~2500 Å. Also, the bridge portion 39 has a height of 2000~2500 Å and a width 1 of 2~3 μm, and hence upon diffusion phosphorus can be doped into the substrate region right under the bridge portion 39, so that the N-type diffused layer 41 can be formed continuously. The phosphorus is also introduced into the polycrystalline silicon layer 37, and its portion 37' becomes a gate electrode having an impurity concentration of $1 \times 10^{20}$ atoms/cm$^3$. Through the last-mentioned oxidation, silicon dioxide film 43 and 44 are formed, and the cavities 57 are filled with the silicon dioxide film 43 and the surface of the silicon layer 37 is covered with the silicon dioxide film 44. (FIG. 3H). In order to fill the cavities 57 of 2000~2500 Å in height, it is only necessary to convert the polycrystalline silicon layer and the monocrystalline silicon substrate of about 1000~1250 Å in thickness into oxide films, and hence, after the last-mentioned oxidation the distance from the extended gate portions 37" and the bridge portion 39 to the surface of the monocrystalline silicon substrate becomes 4000~5000 Å. Next, apertures 45, 46 and 47 are opened by photo-etching in the silicon dioxide films 43 and 44, and thereby portions of the N-type source and drain regions 41, 42 and a portion of the gate lead-out connection portion 38 are exposed (FIG. 31 and 4A).

Figure 4B:
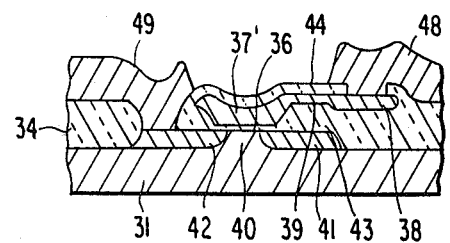
FIGS. 4B and 4C are cross-sectional views taken along lines B—B' and C—C', respectively, in FIG. 4A as viewed in the direction of arrows.
Figure 4C:
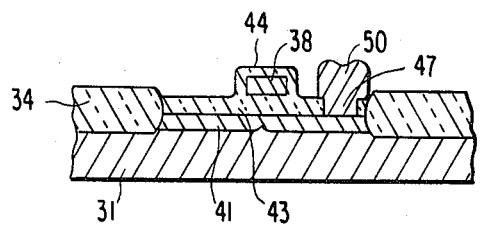

Finally, an aluminum film is deposited over the entire surface by evaporation and selectively removed to form aluminum wiring layers 48, 49 and 50 which are connected to the gate electrode, drain and source regions via the apertures 45, 46 and 47 respectively. Thus, an insulated gate field effect transistor is completed, as shown in FIGS. 4A, 4B and 4C, in which the drain and source regions 41 and 42 are formed in a self-aligned manner with respect to the gate insulating film 36 or the gate electrode portion 37' of polycrystalline silicon, and in which the gate of the IGFET is led out of the transistor structure by the bridge and lead-out portions 39 and 38 crossing the drain or source region 41 in a three-dimensional fashion. From the feature of the second preferred embodiment, it will be appreciated that the direction and number of the lead-out extensions of the gate of the IGFET can be determined quite independently of the source and drain regions.

Accordingly, a monolithic integrated circuit employing a large number of IGFET's according to the present invention can take such an advantage in that freedom in the pattern design can be increased, and thus the present invention can greatly contribute to the enhancement of the degree of circuit integration.

If the channel width W is selected to be the same size of 50 μm as the first preferred embodiment, the effective internal resistance of the gate electrode is reduced to about one-half because the gate electrode is led out from the approximately central portion of the channel width, and hence the operation speed at a peripheral portion 200 of the channel region becomes still higher than that in the case of the first preferred embodiment. It is to be noted that as a matter of course the present invention is also applicable to an IGFET having its channel region formed in an annular shape. Furthermore, the advantages of the present invention can be obtained even if a high melting point metal such as molybdenum or the like is used as a material of the gate electrode.

Third Embodiment

Referring to FIGS. 5A–5F and 5A–5C, a silicon dioxide film 62 is grown to a thickness of about 2000~4000 Å by thermally oxidizing the entire surface of a P-type monocrystalline silicon substrate 61, and is then subjected to photo-etching to form apertures therein. Thereafter thermal oxidation is effected again to form a thin silicon dioxide film 63 of 400~800 Å in thickness to be used as a gate insulator film on the substrate 61 (FIGS. 5A and 5A'). Subsequently, a polycrystalline silicon film of about 6000 Å in thickness is deposited and photo-etching is effected so as to leave only the portion 64 to be used as a gate electrode and to remove the remainder (FIG. 5B and 5B'). A photo-resist film 65 with an aperture 66 is provided over the structure of FIG. 5B (FIGS. 5C and 5C'), and etching is carried out to remove the exposed portion of the thick silicon dioxide film 62 up to the proximity of the gate insulator film 63 by making use of the polycrystalline silicon film 64 and the resist film 65 as a mask and thereby to provide an aperture 67 and cavities 68 by which the surface of the intended source and drain regions in the substrate 61 is exposed. Thereafter the photo-resist film 65 is removed (FIG. 5D).

The last-mentioned etching of the silicon dioxide film 62 is carried out while stirring an etching liquid containing ammonium fluoride and hydrofluoric acid in a ratio of 6 to 1 for the purpose of enhancing the etching efficiency. Since this stirring is not sufficiently effected at the side edge portions of the thin gate insulator film 63 under the gate electrode, etching rate of the thin insulator film 63 becomes very small and the thick silicon dioxide film 62 is predominantly etched. Nevertheless, a minute cavity 69 is formed in the deep portion of a cavity 68 formed under the projected portion of the gate electrode 64, as shown in FIG. 5D. If the size of the minute cavity 69 becomes significant, steam oxidation is preferably effected for 20 minutes at 900° C. to fill the minute cavity 69 with silicon dioxide 71, and at the same time, an oxide film 72 is formed over the surface of the gate electrode 64 made of polycrystalline silicon and an oxide film 70 is also formed on the silicon substrate 61, as shown in FIG. 5E. Thereafter, melt-through-diffusion of phosphorus is carried out for 80 minutes at 920° C. and steam oxidation is effected for 20 minutes at 900° C. to thereby form source and drain regions 73 and dope the gate electrode 64 with the impurity, and the entire device is coated by a silicon dioxide film 74 (FIG. 5F). If the minute cavity 69 is not significant, diffusion of phosphorus could be effected directly to the structure of FIG. 5D, omitting the step shown in FIG. 5E, to bring it to the structure of FIG. 5F. Subsequently, apertures are provided by photo-etching in the silicon dioxide film 74 at the locations on the source and drain regions 73 and on the gate electrode 64, and then aluminum wiring layers are formed which are connected to the source and drain regions 73 and the gate electrode 64 through the apertures, whereby an N-channel type field effect transistor is completed.

According to the third preferred embodiment of the present invention, the geometrical configuration of the thin silicon dioxide film 63 can be determined with high precision irrespective of the etching of the thick polycrystalline silicon film 64. Accordingly, an IGFET having a short channel can be easily formed. Moreover, the plane configuration of the gate electrode 64 can be determined independently of the channel length similarly to the preceding preferred embodiments, so that it is possible to reduce the internal resistance of the gate electrode 64 to a low value.

I claim:

1. A method of defining a gate structure for use in an insulated gate field effect transistor comprising the steps of forming a first insulator film on a first region of a semiconductor substrate; forming a second insulator film on a second region of said semiconductor substrate directly adjacent to said first region, said first insulator film being thicker than said second insulator film; forming a continuous layer of a high melting point material on said first and second insulator films in such a manner that a first portion of said layer lies on said first insulator film and a second portion of said layer lies on said second insulator film, removing at least a part of said first insulator film under said first portion of said layer to form a cavity under said first portion of said layer.

2. The method of claim 1, further comprising the step of introducing an impurity into said first region of said substrate by use of said second portion of said layer as a part of a mask.

3. The method of claim 2, further comprising the step of filling said cavity with an insulating material.

4. The method of claim 1, in which said second insulator film includes a silicon nitride film.

5. The method of claim 1, in which said first and second insulator films are made of silicon oxide.

6. A method of defining a gate electrode structure for use in an insulated gate field effect transistor comprising steps of relatively forming an anti-oxidation coating film on one major surface of a semiconductor substrate, forming an embedded field oxide film by making use of said anti-oxidation coating film as a mask, partially removing said anti-oxidation coating film, forming a semiconductor layer which extends from the removed portion over the remaining anti-oxidation coating film up to said field oxide film, removing said remaining anti-oxidation coating film to form a cavity between said semiconductor layer and said semiconductor substrate, and thereafter forming an impurity region contiguous to said field oxide film within the semiconductor substrate under said cavity by introducing an impurity into the semiconductor substrate.

7. A method of defining a silicon electrode structure in which a center part of said structure extends in one direction on a semiconductor substrate and a side part of said structure projects upwardly from said center part and extends in said one direction on said semiconductor substrate, comprising steps of forming a first insulator film on a first region of said semiconductor substrate, forming a second insulator film on a second region of said semiconductor substrate directly adjacent to said first region, said first insulator film being thicker than said second insulator film, forming a polycrystalline silicon electrode continuously on said first and second insulator films in such a manner that said side part of said electrode is located on said first insulator film and said center part of said electrode lies on said second insulator film, removing at least a part of said first insulator film under said side part of said electrode to form a cavity under said side part of said electrode, and filling said cavity with an insulator material, thereby to obtain said silicon electrode structure with a small internal resistance and a small stray capacitance.

8. A method for manufacturing a semiconductor device comprising the steps of forming a first insulator film on a first region of a semiconductor substrate of a first conductivity type, forming a second insulator film on a second region of said semiconductor substrate directly adjacent to said first region, said first insulator film being thicker than said second insulator film, forming a continuous layer of a high melting point material on said first and second insulator films in such a manner that a first portion of said layer is located on said first insulator film and a second portion of said layer lies on said second insulator film, removing at least a part of said first insulator film under said first portion of said layer to form a cavity under said first portion of said layer and introducing an impurity of the conductivity type opposite said first conductivity type into said first region of said substrate by use of said second portion of said layer as a part of a mask.

* * * * *

UNITED STATES PATENT AND TRADEMARK OFFICE
CERTIFICATE OF CORRECTION

PATENT NO. : 4,343,078
DATED : August 10, 1982
INVENTOR(S) : ISAMU MIYAGI

It is certified that error appears in the above—identified patent and that said Letters Patent is hereby corrected as shown below:

IN THE SPECIFICATION:

Column 1, line 24 - delete "with";

line 38 - change "diffusion" to --diffusing--;

line 54 - change "restriction imposed" to --restriction is imposed--.

Column 2, line 14 - change "there the" to -- there is the--;

line 38 - change "with" to --at--;

line 39 - change "form" to --film--.

Column 3, line 39 - delete "a" (second occurrence).

Column 4, line 17 - change "a" (second occurrence) to --an--;

line 18 - change "uase" to --use--;

line 39 - change "a" to --an--

UNITED STATES PATENT AND TRADEMARK OFFICE
CERTIFICATE OF CORRECTION

PATENT NO. : 4,343,078
DATED : August 10, 1982
INVENTOR(S) : ISAMU MIYAGI

It is certified that error appears in the above—identified patent and that said Letters Patent is hereby corrected as shown below:

IN THE SPECIFICATION:

Column 5, line 19 - change "11 a" to --11 by a--;

line 24 - delete the period (.) after "C";

line 35 - delete the period (.) after "C";

line 36 - change "to" (first occurrence) to --of--;

line 51 - delete "about" (second occurrence);

line 52 - change "of" (first occurrence) to --is--;

line 54 - change "16" " to --16'--;

line 55 - after "diffusion" delete the comma (,);

line 56 - after "C" delete the period (.);

line 59 - after "C" delete the period (.);

line 64 - after "surface" insert --resistivity--.

Column 6, line 33 - after "for" (first occurrence) insert --an--;

line 40 - after "layer" insert --16--;

line 65 - after "C" delete the period (.).

UNITED STATES PATENT AND TRADEMARK OFFICE
CERTIFICATE OF CORRECTION

PATENT NO. : 4,343,078
DATED : August 10, 1982
INVENTOR(S) : ISAMU MIYAGI

It is certified that error appears in the above—identified patent and that said Letters Patent is hereby corrected as shown below:

IN THE SPECIFICATION:

Column 7, line 18 - after "removed," insert --a--;

line 23 - after "C" delete the period (.);

line 38 - after "39" insert --of--;

lines 42 and 43 - after "C" delete the period (.);

line 58 - change "film" to --films--.

Column 8, line 18 - after "38" insert a comma (,);

line 48 - change "5A-5C" to --5A'-5C'--.

Column 9, line 16 - after "C" delete the period (.);

line 23 and line 24 - after "C" delete the period (.).

UNITED STATES PATENT AND TRADEMARK OFFICE
CERTIFICATE OF CORRECTION

PATENT NO. : 4,343,078
DATED : August 10, 1982
INVENTOR(S) : ISAMU MIYAGI

It is certified that error appears in the above—identified patent and that said Letters Patent is hereby corrected as shown below:

IN THE CLAIMS:

Column 10, line 11, change "relatively" to --selectively--;

line 61, after "layer" insert a comma (,).

Signed and Sealed this

Twenty-eighth Day of June 1983

[SEAL]

Attest:

GERALD J. MOSSINGHOFF

Attesting Officer     Commissioner of Patents and Trademarks